United States Patent
Gong et al.

(10) Patent No.: US 12,337,347 B2
(45) Date of Patent: Jun. 24, 2025

(54) LITHIUM-BASED PIEZOELECTRIC MICROMACHINED ULTRASONIC TRANSDUCER

(71) Applicant: Board of Trustees of the University of Illinois, Urbana, IL (US)

(72) Inventors: Songbin Gong, Champaign, IL (US); Ruochen Lu, Austin, TX (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 890 days.

(21) Appl. No.: 17/528,438

(22) Filed: Nov. 17, 2021

(65) Prior Publication Data
US 2022/0184660 A1 Jun. 16, 2022

Related U.S. Application Data

(60) Provisional application No. 63/199,215, filed on Dec. 14, 2020.

(51) Int. Cl.
*B06B 1/06* (2006.01)
*H10N 30/06* (2023.01)
*H10N 30/082* (2023.01)
*H10N 30/20* (2023.01)
*H10N 30/853* (2023.01)
*H10N 30/87* (2023.01)

(52) U.S. Cl.
CPC .......... *B06B 1/0662* (2013.01); *B06B 1/0644* (2013.01); *H10N 30/06* (2023.02); *H10N 30/082* (2023.02); *H10N 30/2047* (2023.02); *H10N 30/8542* (2023.02); *H10N 30/87* (2023.02)

(58) Field of Classification Search
CPC ... B06B 1/0662; B06B 1/0644; B06B 1/0648; H10N 30/06; H10N 30/082; H10N 30/2047; H10N 30/8542; H10N 30/87
See application file for complete search history.

(56) References Cited

U.S. PATENT DOCUMENTS

| | | | |
|---|---|---|---|
| 10,586,912 B2 | 3/2020 | Atev et al. | |
| 10,648,852 B2 | 5/2020 | Akkaraju et al. | |
| 11,677,377 B2 * | 6/2023 | Goto | H03H 3/08 310/313 B |
| 2017/0368574 A1 | 12/2017 | Sammoura et al. | |

(Continued)

OTHER PUBLICATIONS

Baek et al., "Giant piezoelectricity on Si for hyperactive MEMS", Science, vol. 334, No. 6058, pp. 958-961, Nov. 18, 2011.
(Continued)

*Primary Examiner* — Emily P Pham
(74) *Attorney, Agent, or Firm* — Lowenstein Sandler LLP

(57) ABSTRACT

A device includes a pair of substrate layer corresponding to a carrier substrate, an intermediary layer disposed on the pair of substrate layers, a cavity region disposed between the pair of substrate layers underneath the intermediary layer, a piezoelectric layer including a lithium-based film disposed on the intermediary layer, and a plurality of interdigital transducer electrodes disposed on the piezoelectric layer. The plurality of interdigital transducer electrodes includes an outer signal electrode, an inner signal electrode, an outer ground electrode and an inner ground electrode.

13 Claims, 12 Drawing Sheets

(56) References Cited

U.S. PATENT DOCUMENTS

2020/0269280 A1  8/2020  Rothberg et al.

OTHER PUBLICATIONS

Calame et al., "Growth and properties of gradient free sol-gel lead zirconate titanate thin films", Applied Physics Letters, vol. 90, pp. 62907-1-62907-3, 2007.

Dangi et al., "Lithium niobate-based transparent ultrasound transducers for photoacoustic imaging", Optics letters, vol. 44, No. 21, pp. 5326-5329, Nov. 1, 2019.

Dausch et al., "In vivo real-time 3-D intracardiac echo using PMUT arrays", IEEE Transactions on Ultrasonics, Ferroelectrics and Frequency Control, vol. 61, No. 10, Oct. 2014.

Feng et al., "Piezoelectric Micromachined Ultrasonic Transducers with a Cost-Effective Bottom-Up Fabrication Scheme for Millimeter-Scale Range Finding", Sensors vol. 19, No. 4696, 17 pages, 2019.

Gabrielson, T.B., elson, "Mechanical-Thermal Noise in Micromachined Acoustic and Vibration Sensors", IEEE Transactions on Electron Devices, vol. 40, No. 5, pp. 903-909, May 1993.

Gijsenbergh et al., "Characterization of polymer-based piezoelectric micromachined ultrasound transducers for short-range gesture recognition applications", Journal of Micromechanics and Microengineering, vol. 29, No. 074001, 2019.

Gong et al., "Design and analysis of lithium-niobate-based high electromechanical coupling RF-MEMS resonators for wideband filtering", IEEE Transactions on Microwave Theory and Techniques, vol. 61, No. 1, pp. 403-414, Jan. 2013.

Hammoud et al., "UltraSense: A Self-Calibrating Ultrasound-Based Room Occupancy Sensing System", in Procedia Computer Science 109C, pp. 75-83, 2017.

Herrera et al., "AIN pmut-based ultrasonic power transfer links for implantable electronics", in Transducers, pp. 861-864, Jun. 23-27, 2019.

Jiang et al., "Monolithic ultrasound fingerprint sensor", Microsystems and Nanoengineering, 8 pages, 2017.

Levy et al., "Fabrication of single-crystal lithium niobate films by crystal ion slicing", Applied Physics Letters, vol. 73, No. 16, pp. 2293-2295, Oct. 19, 1998.

Liang et al., "Piezoelectric Micromachined Ultrasonic Transducers With Pinned Boundary Structure", Journal of Microelectromechanical Systems, vol. 29, No. 4, pp. 585-591, Aug. 2020.

Liu et al., "Characterization of epitaxial-PZT/SI piezoelectric micromachined ultrasonic transducer (PMUT) and its phased array system", in Transducers, pp. 246-249, Jun. 23-27, 2019.

Lu et al., "Gigahertz Low-Loss and Wide-Band S0 Mode Lithium Niobate Acoustic Delay Lines", IEEE Transactions on Ultrasonics, Ferroelectrics, and Frequency Control, vol. 66, No. 8, pp. 1373-1386, Aug. 2019.

Mehdizadeh et al., "AIN on SOI pMUTs for ultrasonic power transfer", in IEEE International Ultrasonics Symposium, 4 pages, 2017.

Mertin et al., "Enhanced piezoelectric properties of c-axis textured aluminium scandium nitride thin films with high scandium content: influence of intrinsic stress and sputtering parameters", in IEEE International Ultrasonics Symposium, pp. 1-4, 2017.

Muralt et al., "Ferroelectric thin films for microsensors and actuators: a review", Journal of Micromechanics Microengineering, vol. 10, pp. 136-146, 2000.

Pop et al., "Novel pMUT-Based Acoustic Duplexer for Underwater and Intrabody Communication", in IEEE International Ultrasonics Symposium, 4 pages, 2018.

Przbyla et al., "3D ultrasonic gesture recognition", in IEEE International Solid-State Circuits Conference, session 12, 3 pages, Feb. 11, 2014.

Qiu et al., "Piezoelectric micromachined ultrasound transducer (PMUT) arrays for integrated sensing, actuation and imaging", Sensors, vol. 15, pp. 8020-8041, 2015.

Seo et al., "Piezoelectric pressure sensors for hypersonic flow measurements", Journal of Microelectromechanical Systems, vol. 28, No. 2, pp. 271-278, Apr. 2019.

Wang et al., "Design, fabrication, and characterization of scandium aluminum nitride-based piezoelectric micromachined ultrasonic transducers", Journal of Microelectromechanical Systems, vol. 26, No. 5, pp. 1132-1139, Oct. 2017.

Wang et al., "Wireless data links for next-generation networked micro-implantables", in 2018 IEEE Custom Integrated Circuits Conference, 9 pages, 2018.

Muralt, P., "Which is the best thin film piezoelectric material?", in IEEE International Ultrasonics Symposium, 3 pages, 2017.

\* cited by examiner

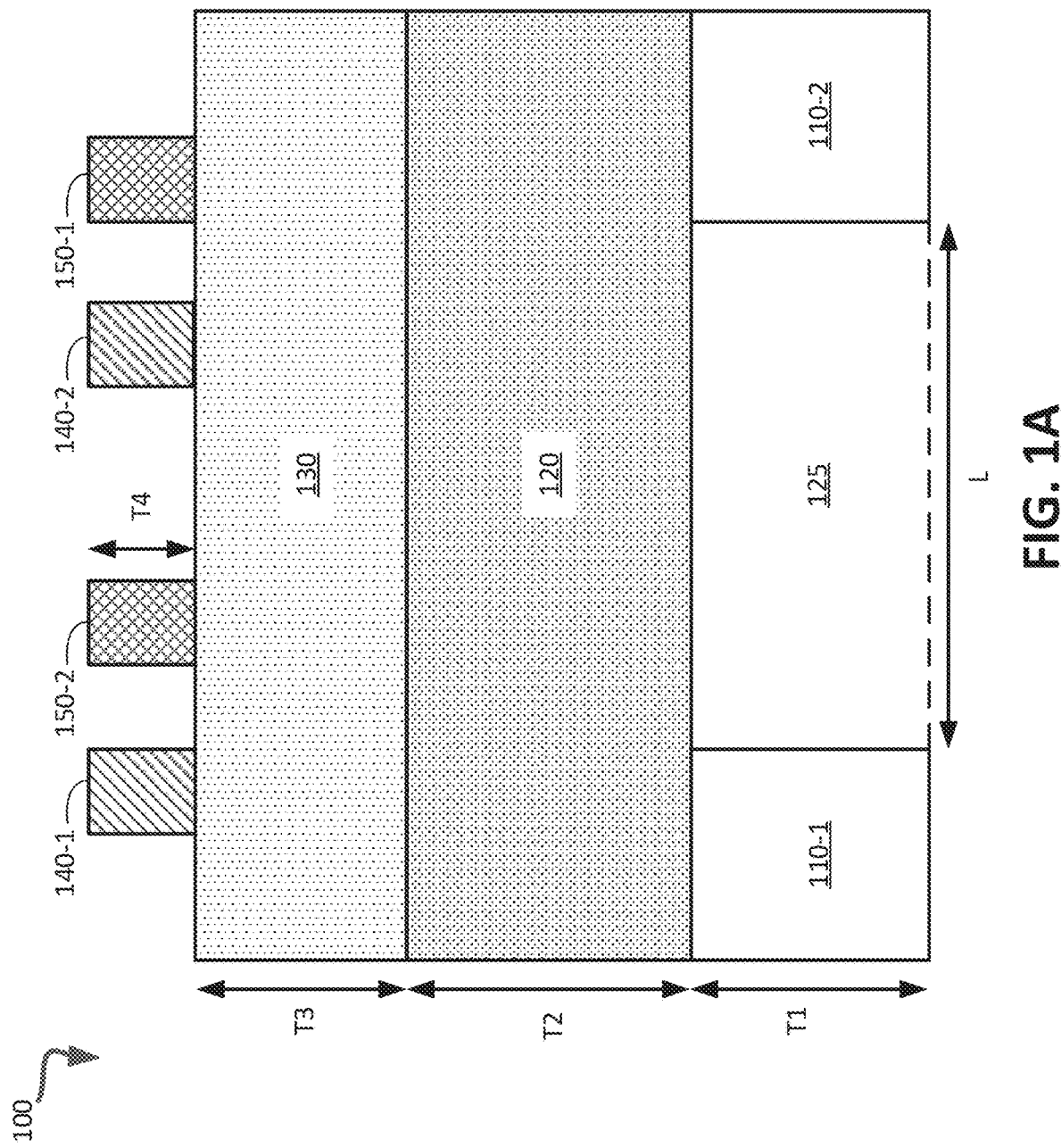

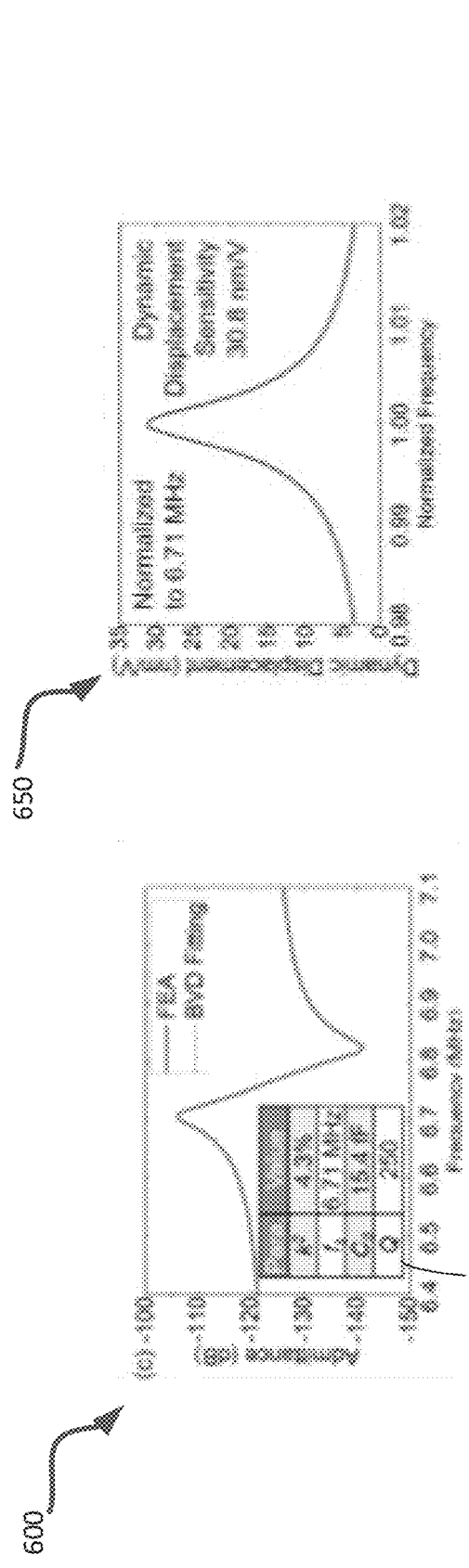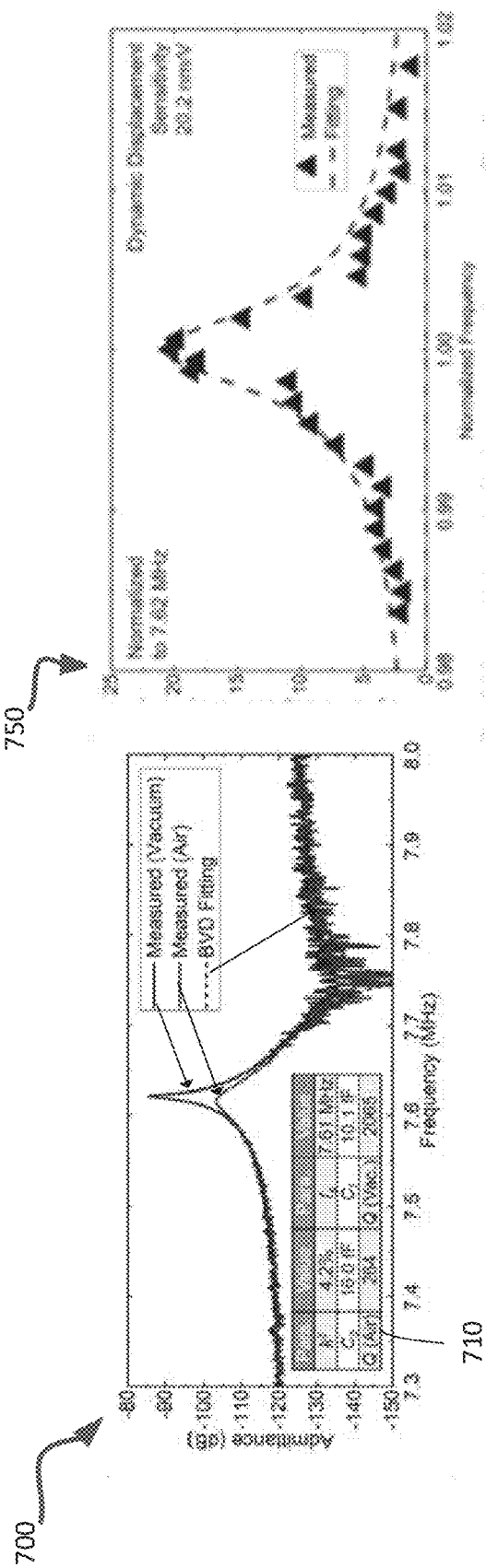
FIG. 6A
FIG. 6B
FIG. 7A
FIG. 7B

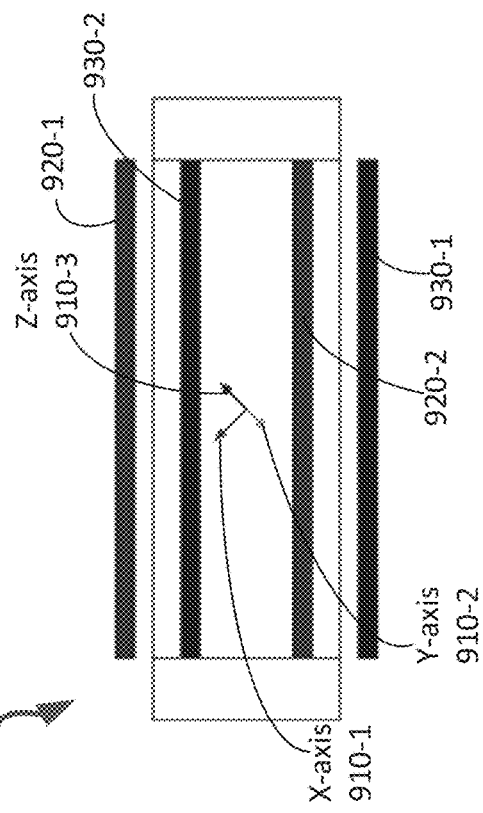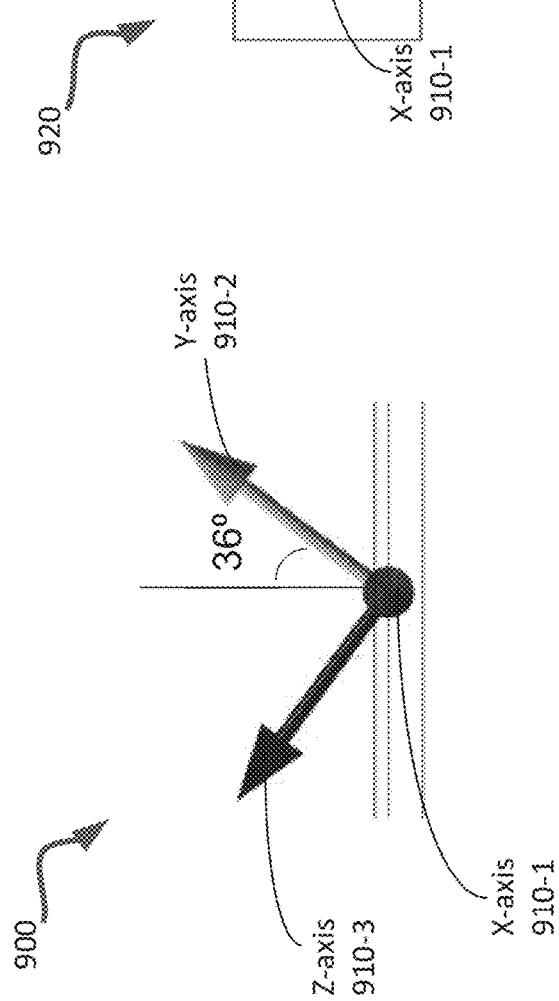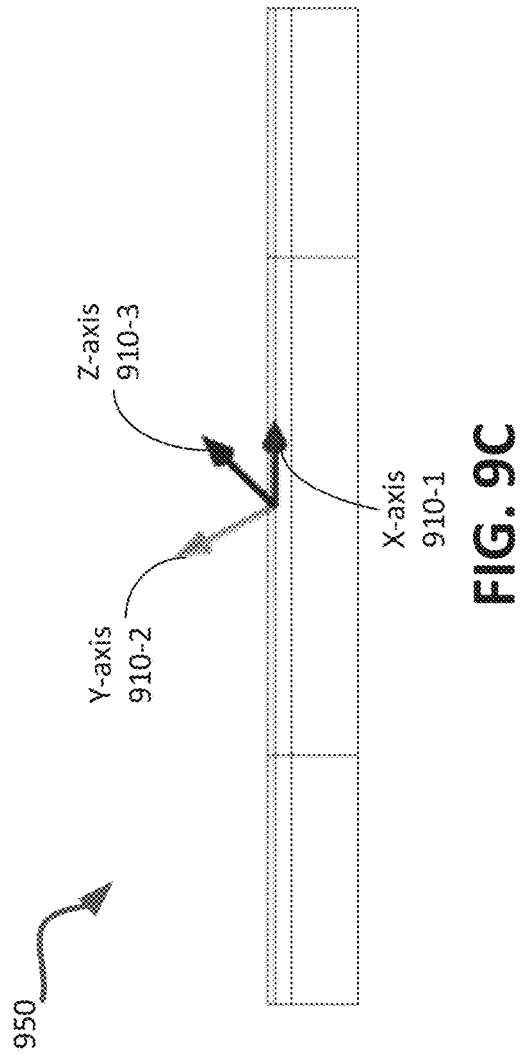
FIG. 9A
FIG. 9B
FIG. 9C

LITHIUM-BASED PIEZOELECTRIC MICROMACHINED ULTRASONIC TRANSDUCER

RELATED APPLICATIONS

The present application claims priority to Provisional U.S. Patent Application No. 63/199,215, filed Dec. 14, 2020, and entitled "LITHIUM-BASED PIEZOELECTRIC MICROMACHINED ULTRASONIC TRANSDUCER," which is incorporated herein by reference in its entirety.

STATEMENT REGARDING FEDERALLY SPONSORED RESEARCH

This invention was made with government support under Grant No. HR001117C0107 awarded by the Defense Advanced Research Projects Agency (DARPA) of the Department of Defense (DOD). The government has certain rights in the invention.

TECHNICAL FIELD

Embodiments of the disclosure relate generally to transducers, and more specifically, relate to lithium-based piezoelectric micromachined ultrasonic transducers (PMUTs)

BACKGROUND

A microelectromechanical system (MEMs), also referred to as a micromachine herein, is a device that can be made up of components having a size between about 1 micron and about 100 microns (μm), with the micromachine generally ranging in size from about 20 μm to about 1000 μm (1 millimeter (mm)). A high bias voltage (e.g., over 100 V) may be needed for capacitive micromachined ultrasonic transducers (CMUTs), so CMUT integration into portable electronics may not be practical.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIGS. 1A-1B are schematic diagrams showing a top-down view and a cross-sectional view, respectively, of a device including a piezoelectric micromachined ultrasonic transducer (PMUT), according to some embodiments.

FIG. 6A is a graph showing simulated admittance from a finite element analysis (FEA) associated with a piezoelectric micromachined ultrasonic transducer (PMUT), according to some embodiments.

FIG. 6B is a graph showing simulated dynamic displacement near resonance associated with a piezoelectric micromachined ultrasonic transducer (PMUT), according to some embodiments.

FIG. 7A is a graph showing measured admittance response in both air and a vacuum associated with a piezoelectric micromachined ultrasonic transducer (PMUT), according to some embodiments.

FIG. 7B is a graph showing measured dynamic displacement near resonance associated with a piezoelectric micromachined ultrasonic transducer (PMUT), according to some embodiments.

FIGS. 9A-9C show diagrams of an exemplary orientation of material axes of a material that can be implemented within a piezoelectric layer, according to some embodiments.

DETAILED DESCRIPTION

Figure 1B:
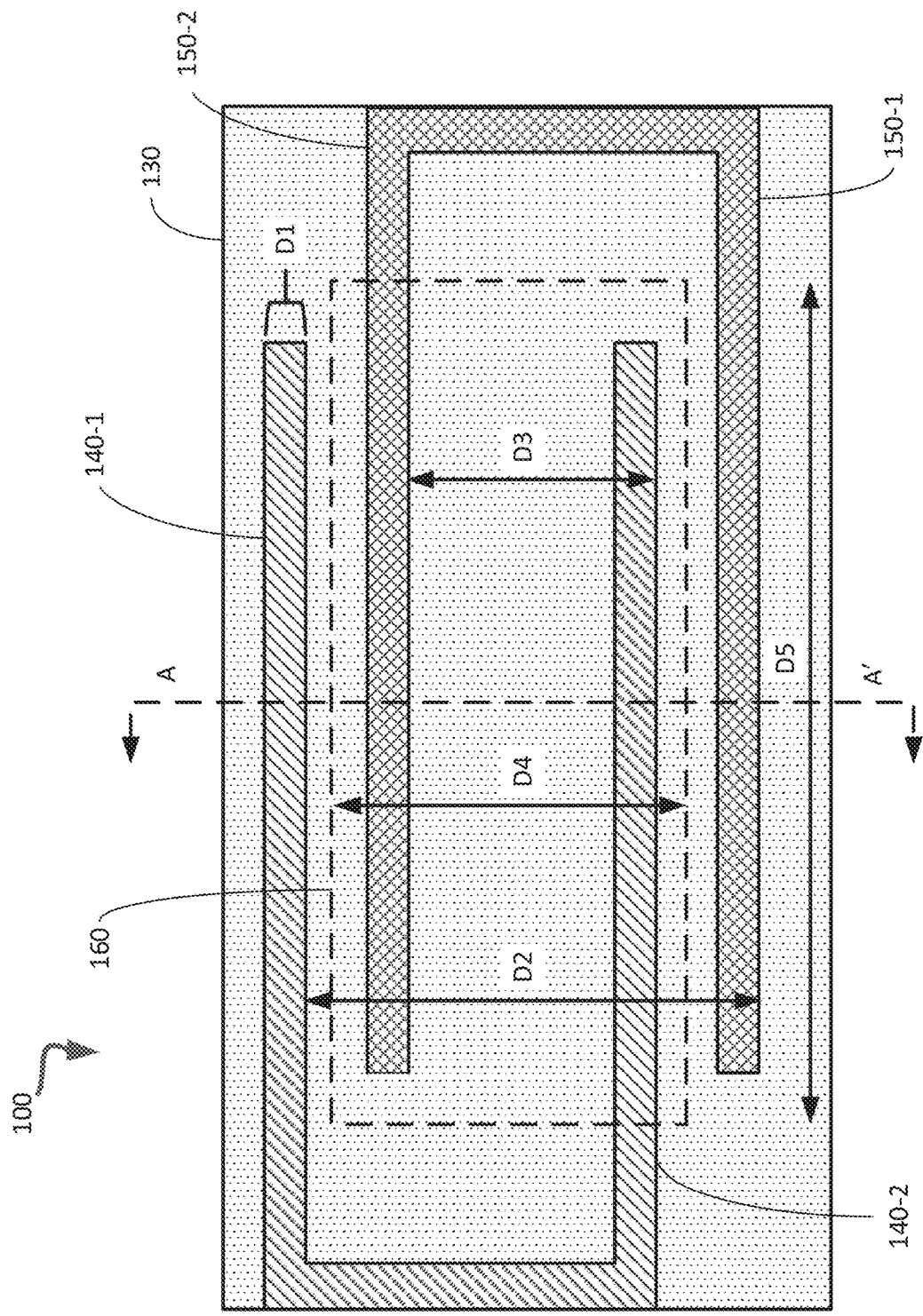

To detect the deformation of flexural structures associated with a transducer, a sensor figure of merit (FoM) for the current/charge response can correspond to a coupling coefficient, e, having units of $C/m^2$, while the sensor FoM for the voltage response can correspond to a ratio between e and the dielectric constant $\varepsilon$, or $e/\varepsilon$, having units of, e.g., GV/m. For the limit of detection FoM, the dissipation in the static capacitance should be considered for calculating the signal-to-noise ratio (SNR), which is proportional to the square root of the product $\varepsilon \times \tan(\delta)$, where $\tan(\delta)$ is the dielectric loss. More specifically, the FoM can be expressed as $e/(\varepsilon \times \tan(\delta))$ having units of, e.g., $10^6$ $(J/m^3)^{1/2}$. On the other hand, for transducers transmitting acoustic energy, large electromechanical coupling ($k^2$) is sought after. In the case of a flexural mode device with a bending layer, the corresponding transducer FoM can be expressed as $e^2/\varepsilon Y$, where Y is the effective rigidity modulus of the passive layer, e.g., Young's modulus of silicon (Si).

Conventional types of piezoelectric micromachined ultrasonic transducers (PMUTs) include ferroelectric perovskites with solid solutions containing lead titanate ($PbTiO_3$) (e.g., lead zirconate titanate (PZT) and lead magnesium niobate-lead titanate (PMN-PT)), and non-ferroelectric structures (e.g., aluminum nitride (AlN) or aluminum scandium nitride (AlScN)), but common materials are lead-containing thin films. AlN and AlScN-based PMUTs can excel as a receiver/sensor, but can suffer as a transducer due to having a relatively low electromechanical coupling ($k^2$) value. PZT-based and PMN-PT-based PMUTs can excel at transduction, but can underperform for sensing due to their relatively large values of $\varepsilon$ and $\tan(\delta)$.

Aspects of the present disclosure provide for lithium-based piezoelectric micromachined ultrasonic transducer (PMUT). Some embodiments provide for a lithium niobate ($LiNbO_3$)-based or lithium tantalate ($LiTaO_3$) PMUT. For example, the $LiNbO_3$-based PMUT can include a piezoelectric layer composed of a $LiNbO_3$ film, which can in some embodiments be a thin-film. $LiNbO_3$ provides a higher transducer FoM and SNR compared to those that can be achieved by PZT and its derivatives due to relatively lower ε and tan(δ) values. $LiNbO_3$ also outperforms AlN as a transducer while offering on-par sensor FoMs. Further, by way of example, similar to the $LiNbO_3$-based PMUT, the $LiTaO_3$-based PMUT can include a piezoelectric layer composed of a $LiTaO_3$ film, which can in some embodiments be a thin-film. Although $LiNbO_3$ and $LiTaO_3$ are specifically referred to herein, other lithium-based materials that are suitable for use as piezoelectric materials with the disclosed properties are also viable alternatives.

In various embodiments, the lithium-based PMUTs described herein can be fabricated using a fabrication technique in which the top electrodes are first defined, and then an air cavity is built using etching (e.g., reactive-ion etching (RIE)) to form a suspended structure (e.g., a two-mask fabrication technique). Transfer techniques can allow for access to a thin film of lithium-based piezoelectric material. Unlike other deposition methods, such transfer techniques can grant access to the piezoelectric layer with different orientations.

A lithium-based PMUT in accordance with the embodiments described herein can achieve efficient flexural mode excitation using a lateral-field-excitation (LFE) structure to maximize transduction, and can have balanced ultrasound receiving and transmitting (i.e., transceiver) properties. Accordingly, a lithium-based PMUT in accordance with the embodiments described herein can be employed within a variety of useful applications, including ultrasonic medical imaging, wireless communications, powering, finger print sensing, gesture recognition, flow sensing, indoor occupancy sensing, and other miniature ultrasound applications.

FIGS. 1A-1B are schematic diagrams showing a cross-sectional view and a top-down view, respectively, of a device 100 including a piezoelectric micromachined ultrasonic transducer (PMUT), according to some embodiments. The cross-sectional view in FIG. 1A is taken through a cross-section through the device 100 shown in FIG. 1B corresponding to line A-A'.

As shown in FIG. 1A, the device 100 includes a substrate layer 110-1 and a substrate layer 110-2. The substrates layers 110-1 and 110-2 correspond to a carrier substrate or wafer that can be removed to provide mechanically free boundaries. The substrate layers 110-1 and 110-2 can include any suitable material(s) in accordance with the embodiments described herein. In some embodiments, the substrate layers 110-1 and 110-2 include a semiconductor material. For example, the substrate layers 110-1 and 110-2 can include silicon (Si). The substrate layers 110-1 and 110-2 can have any suitable thickness or height in accordance with the embodiments described herein. In some embodiments, the substrate layers 110-1 and 110-2 can have a thickness or height, T1, between about 20 microns (μm) and about 700 μm. More particularly, T1 can be about 50 μm. The device 100 further includes an intermediary layer 120 disposed on the substrate layers 110-1 and 110-2.

In some embodiments, the intermediary layer 120 includes a passive layer. The passive layer can include any suitable material(s) in accordance with the embodiments described herein. In some embodiments, the passive layer includes a dielectric material. For example, the passive layer can include an oxide. In one embodiment, the passive layer includes silicon dioxide ($SiO_2$). The passive layer can be formed to have any suitable thickness or height in accordance with the embodiments described herein. In some embodiments, the passive layer can have a thickness or height, T2, between about 1 μm and about 3 μm. More particularly, T2 can be about 2 μm.

In some embodiments, the intermediary layer 120 includes a layer of a lithium-based material. For example, the intermediary layer 120 can include a $LiNbO_3$ material and/or a $LiTaO_3$ material. In this embodiment, the device 100 is formed as a bilayer (complementarily oriented piezoelectric) lithium-based PMUT. The layer of the lithium-based material can be formed to have any suitable thickness or height in accordance with the embodiments described herein. In some embodiments, the layer of the lithium-based material can be formed have a thickness or height between about 0.5 μm and about 2 μm. More particularly, T2 can be about 0.8 μm.

The device 100 further includes a cavity region 125 defined by the substrate layers 110-1 and 110-2 and the intermediary layer 120. The cavity region 125 is configured to enable propagation of acoustic waves. The length of the cavity region 125, L, can be set to be much longer than its width, T1, to reduce mode distortion from the fixed boundaries in a transverse direction, as seen in the three-dimensional (3D) mode shape that will be described in further detail below with reference to FIG. 5. In some embodiments, L can be between about 220 μm and about 260 μm. More particularly, L can be about 240 μm. In some embodiments, the cavity region 125 corresponds to an air cavity. In some embodiments, the cavity region 125 can be filled with a liquid that can enable propagation of acoustic waves. For example, the liquid can be water. However, such an embodiment should not be considered limiting. In other embodiments, the cavity region 125 corresponds to a vacuum cavity. Further details regarding the formation of the cavity region 125 will described below with reference to FIGS. 2A-2C and FIG. 3.

The device 100 further includes piezoelectric layer 130 including a lithium-based film. More specifically, the piezoelectric layer 130 can include a suspended lithium-based film. For example, the piezoelectric layer 130 can be a suspended lithium-based thin film. The piezoelectric layer 130 can have any suitable thickness or height in accordance with the embodiments described herein. In some embodiments, the piezoelectric layer 130 can have a thickness or height, T3, between about 0.5 μm and about 1.2 μm. More particularly, T3 can be about 0.8 μm. Therefore, in the embodiment in which the intermediary layer 120 includes a layer of a lithium-based material, the piezoelectric layer 130 can have about the same thickness as the intermediary layer 120, T2 (e.g., about 0.8 μm). However, the thicknesses can be slightly different while still resulting in an appropriately functioning device 200. A thickness ratio between the intermediary layer 120 and the piezoelectric layer 130 can be selected to efficiently harness the piezoelectricity generated by the device 100. For example, in the embodiment in which the intermediary layer 120 includes a passive layer, if T2 is about 2 μm and the thickness of the piezoelectric layer 130 is about 0.8 μm, the thickness ratio between the intermediary and piezoelectric layers 120 and 130 and is about 25.

The device 100 further includes an outer signal electrode 140-1, an outer ground electrode 150-1, an inner signal electrode 140-2, and an inner ground electrode 150-2 corresponding to interdigital transducer electrodes (IDT electrodes), referred to herein as "electrodes" for simplicity, disposed on the piezoelectric layer 130. More specifically, signal electrodes 140-1 and 140-2 can be input voltage signal (VIN) electrodes). The electrodes 140-1, 140-2, 150-1 and 150-2 can include any suitable conductive material(s) in accordance with the embodiments described herein. Examples of suitable conductive materials include, but are not limited to, aluminum (Al), copper (Cu), gold (Au), silver (Ag), etc. The electrodes 140-1, 140-2, 150-1 and 150-2 can have any suitable thickness(es) or height(s) in accordance with the embodiments described herein. In some embodiments, the electrodes 140-1, 140-2, 150-1 and 150-2 can each have a thickness or height, T4, between about 0.1 μm and about 5 μm. More particularly, T4 can be about 0.3 μm. As shown in FIG. 1B, the electrodes 140-1, 140-2, 150-1 and 150-2 can have a width D1. In some embodiments, D1 can be between about 3 μm and about 7 μm. More particularly, D1 can be about 5 μm. As further shown, a distance D2 can be defined between the outer signal electrode 140-1 and the outer ground electrode 150-1, and a distance D3 can be defined between the inner signal electrode 140-2 and the outer ground electrode 150-2. In some embodiments, D2 can be between about 70 μm and about 80 μm, and D3 can be between about 25 μm and about 35 μm. More particularly, D2 can be about 75 μm and D3 can be about 30 μm.

In some embodiments, the piezoelectric layer 130 includes a $LiNbO_3$ film. In some embodiments, the piezoelectric layer 130 includes a $LiTaO_3$ film. $LiNbO_3$ and $LiTaO_3$ have very similar matrix structure, and thus the $LiTaO_3$ film can have a similar cut-plane orientation as the $LiNbO_3$ film in disclosed embodiments. The piezoelectric layer 130 can have any suitable device orientation in accordance with the embodiments described herein, where the device orientation corresponds to the lateral electric field direction.

For example, the piezoelectric layer 130 can include a $LiNbO_3$ wafer having between a 36° and a 46° Y-cut orientation. In this arrangement, the device orientation can be in-plane clockwise or counterclockwise rotated from a $LiNbO_3$ material x-axis of the lattice structure by an angle between about 35° and about 55°. More particularly, in some embodiments, the device orientation can be rotated by about 45° clockwise from the $LiNbO_3$ material x-axis. In an illustrative example, the device 100 can be oriented at between 40° to 45° (e.g., at 43°, for example) from the $LiNbO_3$ material x-axis of a 36° Y-cut $LiNbO_3$ wafer, for maximizing the $k^2$ value.

As another example, the piezoelectric layer 130 can include a $LiNbO_3$ wafer having a 128° Y-cut orientation. In this arrangement, the device orientation can be in-plane clockwise or counterclockwise rotated from the $LiNbO_3$ material x-axis by an angle between about 80° and about 100°. More particularly, in some embodiments, the device orientation can be rotated by about 90° clockwise from the $LiNbO_3$ material x-axis.

As yet another example, the piezoelectric layer 130 can include a $LiNbO_3$ wafer having an X-cut orientation. In this arrangement, the device orientation can be in-plane counterclockwise rotated from the $LiNbO_3$ material x-axis by an angle between about 20° and about 40°, or clockwise rotated from the $LiNbO_3$ material x-axis by an angle between about 140° and about 160°. More particularly, in some embodiments, the device orientation can be rotated by about 30° counterclockwise from the $LiNbO_3$ material x-axis. Further details regarding orientations of material axes associated with an exemplary 36° Y-cut $LiNbO_3$ wafer orientation will now be described below with reference to FIGS. 9A-C.

FIGS. 9A-C show diagrams 900, 920 and 950 of an orientation of material axes of a material that can be implemented within a piezoelectric layer, according to some embodiments. For example, the piezoelectric layer can be the piezoelectric layer 130 of FIGS. 1A-1B. In some embodiments, the material is a lithium-based material. For example, the material can include $LiNbO_3$ or $LiTaO_3$.

More particularly, diagram 900 shows material axes including x-axis 910-1, y-axis 910-2 and z-axis 910-3, diagram 920 in a top-down view showing the axes 910-1 through 910-3 in relationship to electrodes 920-1, 920-2, 930-1 and 930-2 (e.g., corresponding to electrodes 140-1, 140-2, 150-1 and 150-2 shown in the top-down view of FIG. 1B), and diagram 950 is a cross-sectional view showing the axes 910-1 through 910-3 (e.g., corresponding to the cross-sectional view of FIG. 1A). In this embodiment, the x-axis 910-1 is an in-plane axis, and the y-axis 910-2 is oriented 36° out-of-plane relative to the normal through the x-axis 910-1. Thus, the illustrative embodiment of FIGS. 9A-9B depict an orientation of a 36° Y-cut $LiNbO_3$ wafer.

Referring back to FIGS. 1A-1B, in the embodiment in which the intermediary layer 120 includes a lithium-based material, the intermediary layer 120 can be formed from the same lithium-based material as the piezoelectric layer 130, but having a different material axis orientation. More specifically, the intermediary layer 120 can include a first layer of a lithium-based material and the piezoelectric layer 130 can include a second layer of a lithium-based material with a complementary orientation relative to the first layer (i.e., the material axes in the intermediary layer 120 can be rotated about 180° from the piezoelectric layer 130, either through in-plane or out-of-plane rotation). Alternatively, the intermediary layer 120 can be formed from a different type of lithium-based material. Further details regarding the orientation of the first and second layers of the lithium-based material will now be described below with reference to FIGS. 10A-10B.

Figure 10A:
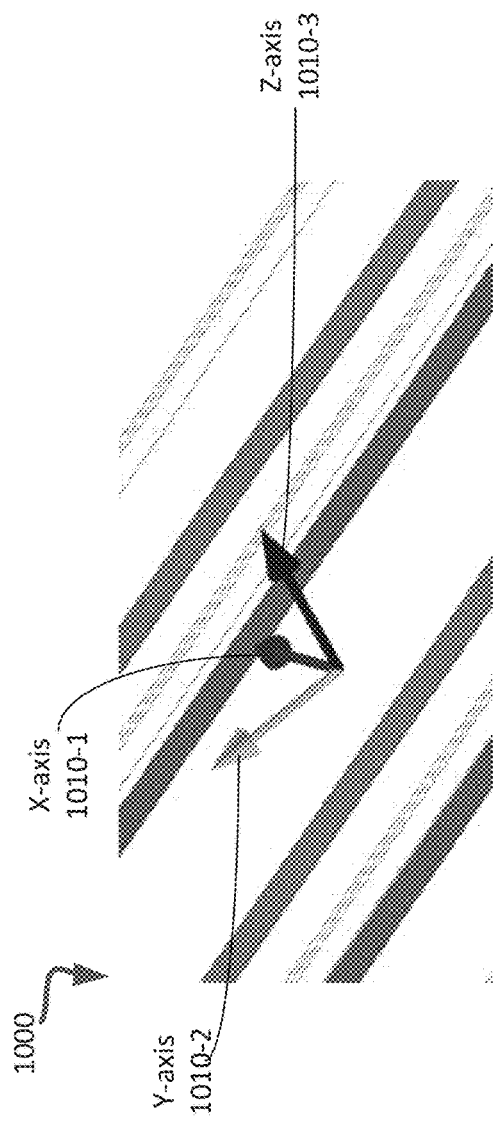
FIGS. 10A-10B show diagrams of material axes in first and second layers, respectively, of a lithium-based material of a bilayer lithium-based piezoelectric micromachined ultrasonic transducer (PMUT), according to some embodiments.
Figure 10B:
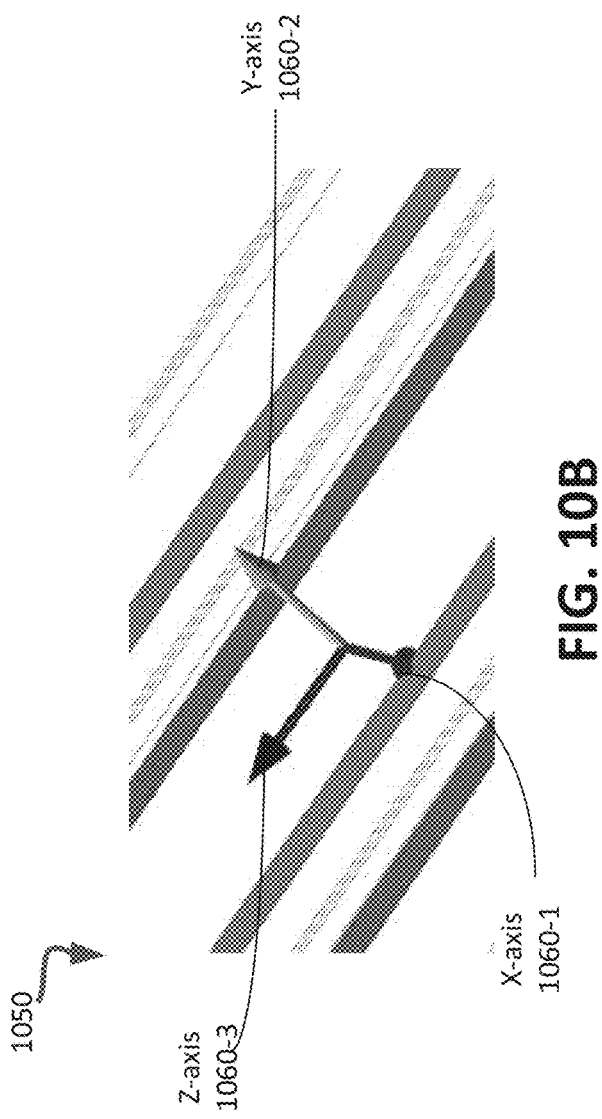

FIGS. 10A-10B show diagrams of material axes 1000 and 1050 in first and second layers of a lithium-based material of a bilayer lithium-based PMUT. More specifically, the material axes 1000 include an x-axis 1010-1, a y-axis 1010-2 and a z-axis 1010-3 corresponding to a piezoelectric layer (e.g., the piezoelectric layer 130 of FIGS. 1A and 1B), and the material axes 1050 include an x-axis 1060-1, a y-axis 1060-2, and a z-axis 1060-3 corresponding to an intermediary layer (e.g., the intermediary layer 220 of FIG. 2A). For example, the x-axes 1010-1 and 1060-1 can be in-plane axes, and the y-axes 1010-2 and 1060-2 can be oriented 36° to the out-of-plane vector. The material axes 1050 can be rotated 180° relative to the material axes 1000 (e.g., through in-plane or out-of-plane rotation).

As further shown in FIG. 1B, the device 100 further includes a release window 160 corresponding to the region indicated by the dashed box. More specifically, the release window 135 includes portions of the piezoelectric layer 130, the inner signal electrode 140-2 and the inner ground electrode 150-2. The release window 160 has a width D4 and a length D5. In some embodiments, D4 can be between about 40 μm and about 60 μm, and D5 can be between about 220 μm and about 260 μm. More particularly, D4 can be about 240 μm and D5 can be about 240 μm.

In operation, the piezoelectric layer 130 may be adapted to propagate a Lamb ordered mode excited by a component of an electric field (not shown). The component of the electric field may be oriented in a longitudinal direction along a length of the piezoelectric layer 130 and/or oriented in a lateral direction along a thickness of the piezoelectric layer 130. The piezoelectric layer 130 and the electrodes 140 and 150 can form a resonator, and the electric field may drive the resonator.

More specifically, the lateral electric field generates a lateral stress ($T_x$) in the piezoelectric layer 130 based on the coupling coefficient e of the piezoelectric layer 130. For example, if the piezoelectric layer 130 includes 36° Y-cut $LiNbO_3$, the piezoelectric layer 130 can have an e value of about 4.61 $C/m^2$. The longitudinal ends of the suspended region are mechanically fixed because of larger acoustic impedance outside of the release window 160. Thus, the flexural mode is excited with $T_x$ of the opposite sign in the intermediary layer 120. To maximize transduction, the electrodes 140 and 150 are alternatingly connected to the signal and ground and can be placed on the nulls of $T_x$. The outer portions of the electrodes 140 and 150 can be placed outside of the release window 160 to efficiently harness the piezoelectricity (in addition to the selection of the thickness ratio of T1:T2 as described above).

Figure 2A:
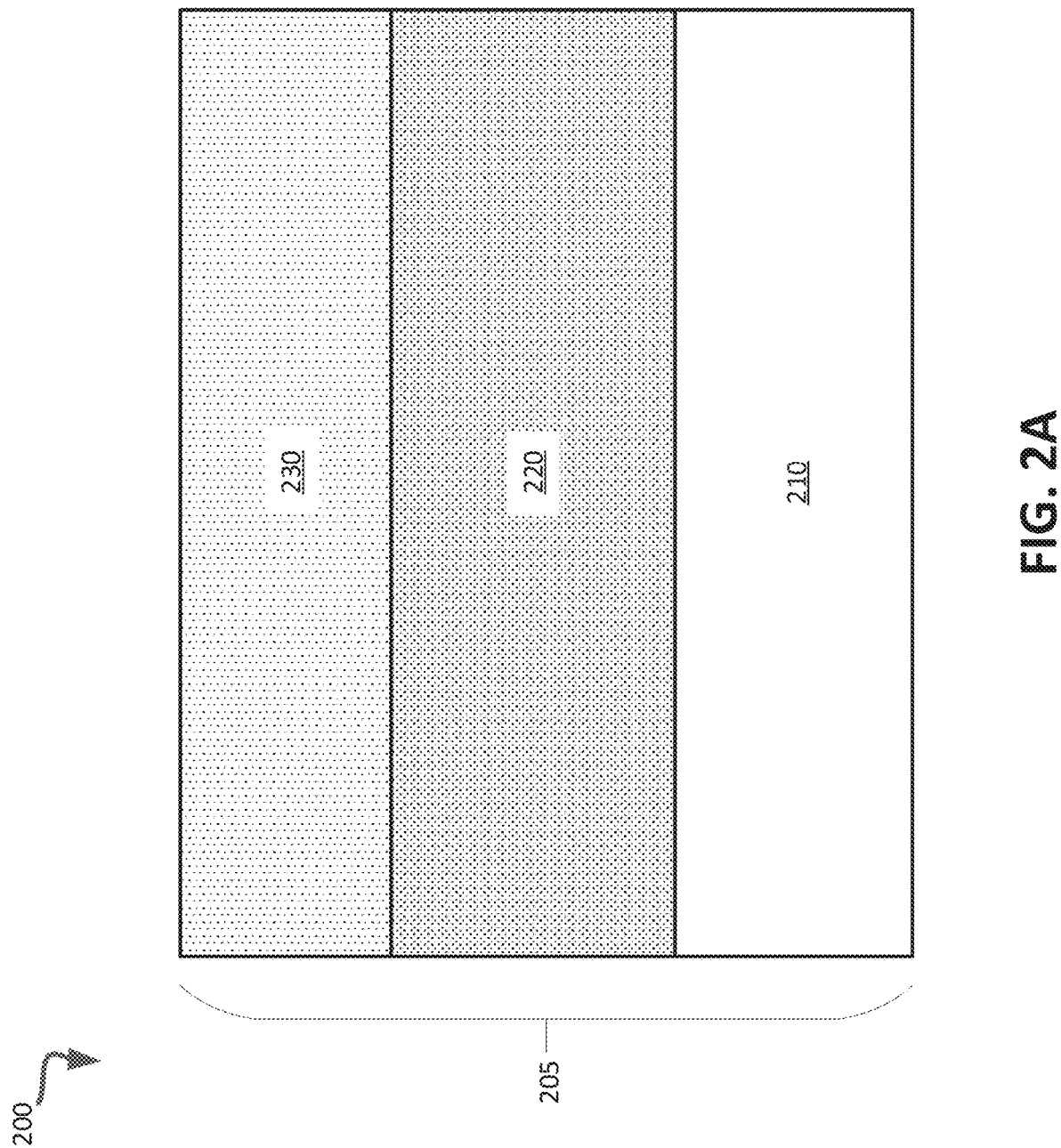
FIGS. 2A-2D are diagrams of steps of a process flow for fabricating a device including a piezoelectric micromachined ultrasonic transducer (PMUT), according to some embodiments.

FIGS. 2A-2D are diagrams illustrating steps of a process flow for fabricating a device 200 including a lithium-based piezoelectric micromachined ultrasonic transducer (PMUT), according to some embodiments. FIG. 2A shows the formation of a base structure 205. More specifically, forming the base structure 205 includes forming an intermediary layer 220 on a substrate 210, and forming a piezoelectric layer 230 on the intermediary layer 220.

The substrate 210 can include any suitable material in accordance with the embodiments described herein. In some embodiments, the substrate includes a semiconductor material. For example, the substrate can include silicon (Si). However, such an embodiment should not be considered limiting. The substrate 210 can be formed to have any suitable thickness or height in accordance with the embodiments described herein. In some embodiments, the substrate 210 can be formed to have a thickness or height between about 20 microns (μm) and about 700 μm. More particularly, the substrate 210 can be formed to have a thickness or height of about 50 μm.

The intermediary layer 220 can include any suitable material in accordance with the embodiments described herein. For example, in some embodiments, the intermediary layer 220 includes a passive layer. The passive layer can include any suitable material(s) in accordance with the embodiments described herein. In some embodiments, the passive layer includes a dielectric material. For example, the passive layer can include an oxide. In one embodiment, the passive layer includes silicon dioxide ($SiO_2$). The passive layer can be formed to have any suitable thickness or height in accordance with the embodiments described herein. In some embodiments, the passive layer can be formed have a thickness or height between about 1 μm and about 3 μm. More particularly, the passive layer can be formed to have a thickness or height of about 2 μm.

In some embodiments, the intermediary layer 220 includes a layer of a lithium-based material. For example, the intermediary layer 220 can include a $LiNbO_3$ material and/or a $LiTaO_3$ material. In this embodiment, the device 200 is formed as a bilayer (complementarily oriented piezoelectric) lithium-based PMUT. The layer of the lithium-based material can be formed to have any suitable thickness or height in accordance with the embodiments described herein. In some embodiments, the layer of the lithium-based material can be formed have a thickness or height between about 0.5 μm and about 2 μm. More particularly, the layer of the lithium-based material can be formed to have a thickness or height of about 0.8 μm.

The piezoelectric layer 230 includes a lithium-based film. More specifically, the piezoelectric layer 230 can include a suspended lithium-based film. For example, the piezoelectric layer 230 can be a suspended lithium-based thin film. The piezoelectric layer 230 can be formed to have any suitable thickness or height in accordance with the embodiments described herein. In some embodiments, the piezoelectric layer 230 can be formed to have a thickness or height between about 0.5 μm and about 2 μm. More particularly, the piezoelectric layer 230 can be formed to have a thickness or height of about 0.8 μm. Therefore, in the embodiment in which the intermediary layer 220 includes a layer of a lithium-based material, the piezoelectric layer 230 can have about the same thickness as the intermediary layer 220. However, the thicknesses can be slightly different while still resulting in an appropriately functioning device 200. A thickness ratio between the intermediary layer 220 and the piezoelectric layer 230 can be selected to efficiently harness the piezoelectricity generated by the device 200. For example, in the embodiment in which the intermediary layer 220 includes a passive layer, if the thickness of the intermediary layer 220 is about 2 μm and the thickness of the piezoelectric layer 230 is about 0.8 μm, the thickness ratio between passive and piezoelectric layers 220 and 230 and is about 25.

In some embodiments, the piezoelectric layer 230 can be formed to include a $LiNbO_3$ film. In some embodiments, the piezoelectric layer 230 can be formed to include a $LiTaO_3$ film. $LiNbO_3$ and $LiTaO_3$ have very similar matrix structure, and thus the $LiTaO_3$ film can have a similar cut-plane orientation as the $LiNbO_3$ film. The piezoelectric layer 230 can have any suitable device orientation in accordance with the embodiments described herein, where the device orientation corresponds to the lateral electric field direction.

For example, the piezoelectric layer 230 can include a $LiNbO_3$ wafer having between a 36° and a 46° Y-cut orientation. In this arrangement, the device orientation can be in-plane clockwise or counterclockwise rotated from a $LiNbO_3$ material x-axis of the lattice structure by an angle between about 35° and about 55°. More particularly, in some embodiments, the device orientation can be rotated by about 45° clockwise from the $LiNbO_3$ material x-axis. In an illustrative example, the device 100 can be oriented at between 40° to 45° (e.g., at 43°, for example) from the $LiNbO_3$ material x-axis of a 36° Y-cut $LiNbO_3$ wafer, for maximizing the $k^2$ value.

As another example, the piezoelectric layer 230 can include a $LiNbO_3$ wafer having a 128° Y-cut orientation. In this arrangement, the device orientation can be in-plane clockwise or counterclockwise rotated from the $LiNbO_3$ material x-axis by an angle between about 80° and about 100°. More particularly, in some embodiments, the device orientation can be rotated by about 90° clockwise from the $LiNbO_3$ material x-axis.

As yet another example, the piezoelectric layer 230 can include a $LiNbO_3$ wafer having an X-cut orientation. In this arrangement, the device orientation can be in-plane counterclockwise rotated from the $LiNbO_3$ material x-axis by an angle between about 20° and about 40°, or clockwise rotated from the $LiNbO_3$ material x-axis by an angle between about 140° and about 160°. More particularly, in some embodiments, the device orientation can be rotated by about 30° counterclockwise from the $LiNbO_3$ material x-axis. In the embodiment in which the intermediary layer 220 includes a lithium-based material, the intermediary layer 220 can be formed from the same lithium-based material as the piezoelectric layer 230, but having a different material axis orientation. More specifically, the intermediary layer 220 can include a first layer of a lithium-based material and the piezoelectric layer 230 can include a second layer of a lithium-based material with a complementary orientation relative to the first layer (i.e., the material axes in the intermediary layer 220 can be rotated about 180 degrees from the piezoelectric layer 230, either through in-plane or out-of-plane rotation).

The intermediary layer 220 can alternatively be formed from a different lithium-based material from the piezoelectric layer 230. For example, one of the intermediary layer 220 and the piezoelectric layer 230 can include $LiNbO_3$, and the other one of the intermediary layer 220 and the piezoelectric layer 230 can include $LiTaO_3$.

The base structure 205 can be a film stack. In one embodiment, the base structure 205 can be formed as a $LiNbO_3$—$SiO_2$—Si film stack. In another embodiment, the base structure 205 can be formed as a $LiNbO_3$—$LiNbO_3$—Si film stack. In another embodiment, the base structure 205 can be formed as a $LiTaO_3$—$SiO_2$—Si film stack. In another embodiment, the base structure 205 can be formed as a $LiTaO_3$—$LiTaO_3$—Si film stack. In another embodiment, the base structure 205 can be formed as a $LiNbO_3$—$LiTaO_3$—Si film stack. In another embodiment, the base structure 205 can be formed as a $LiTaO_3$—$LiNbO_3$—Si film stack. However, such a listing should not be considered exhaustive, and other combinations of materials are contemplated.

Figure 2B:
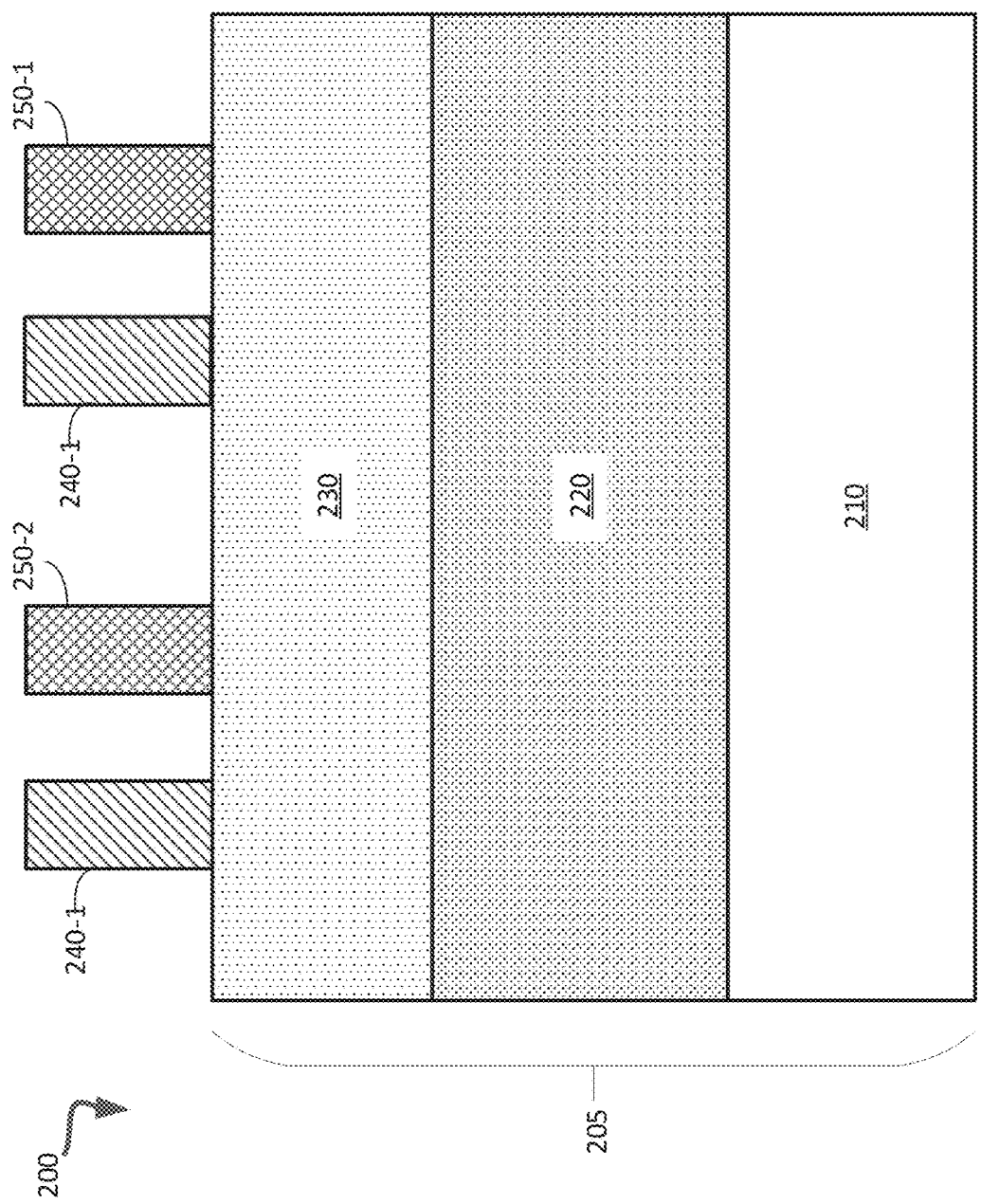

FIG. 2B shows the formation of a plurality of interdigital transducer electrodes (IDT electrodes) on the base structure. More specifically, the plurality of IDT electrodes can include an outer signal (e.g., input voltage signal (VIN)) electrode 240-1, an inner signal electrode 240-2, an outer ground electrode 250-1, and an inner ground electrode 250-2. The piezoelectric layer 230 and the electrodes 240 and 250 can form a resonator, and an electric field may drive the resonator. The electrodes 240 and 250 can be formed to include any suitable material(s) in accordance with the embodiments described herein. Examples of suitable material(s) that can be used to form the electrodes 240 and 250 include, but are not limited to, aluminum (Al), copper (Cu), gold (Au), silver (Ag), etc.

In some embodiments, the electrodes 240 and 250 can each be formed to have a thickness or height between about 0.1 μm and about 5 μm. More particularly, the electrodes 240 and 250 can each be formed to have a thickness or height of about 0.3 μm.

In some embodiments, the electrodes 240 and 250 can each be formed to have a width between about 3 μm and about 7 μm. More particularly, the electrodes 240 and 250 can each be formed to have a width of about 5 μm.

In some embodiments, the outer signal electrode 240-1 and the outer ground electrode 250-1 can each be formed to have a separation corresponding to an outer electrode distance between about 70 μm about 80 μm. More particularly, the outer electrode distance can be about 75 μm.

In some embodiments, the inner signal electrode 240-2 and the inner ground electrode 250-2 can each be formed to have a separation corresponding to an inner electrode distance between about 25 μm and about 35 μm. More particularly, the inner electrode distance can be about 30 μm.

A release window of the device (not shown) includes portions of the piezoelectric layer, the inner signal electrode and the inner ground electrode. In some embodiments, the width of the release window can be between about 40 μm and about 60 μm, and the length of the release window can be between about 220 μm and about 260 μm. More particularly, the width of the release window can be about 240 μm and the length of the release window can be about 240 μm. Further details regarding the release window are described above with reference to FIG. 1B.

Figure 2C:
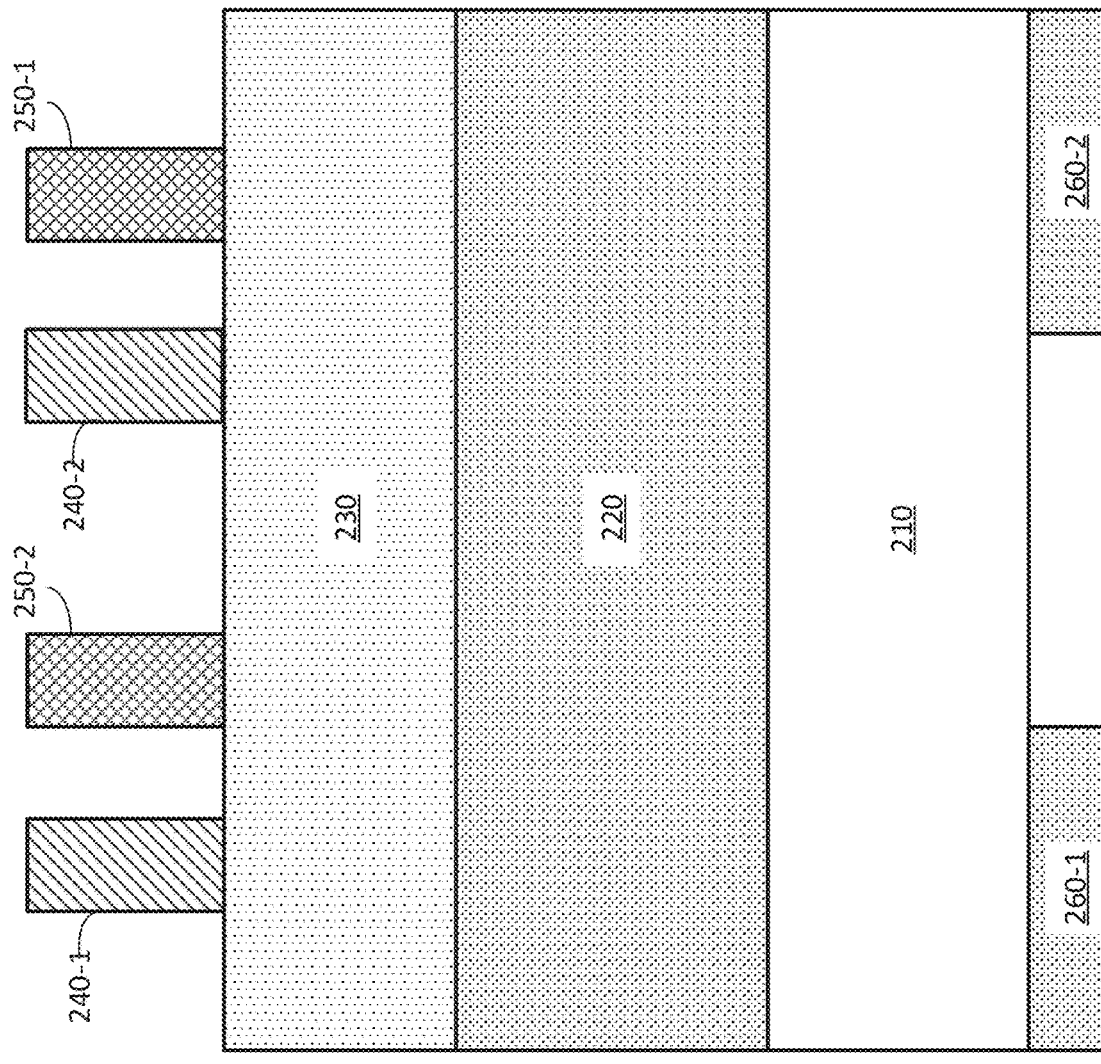

FIG. 2C shows the formation of a pair of masks 260-1 and 260-2 underneath the substrate 210. As will be described below with reference to FIG. 2D, the pair of masks 260-1 and 260-2 are formed as part of a two-mask technique implemented to build an air cavity within the substrate 210 underneath the intermediary layer 220. The pair of masks 260-1 and 260-2 can include any suitable material(s) in accordance with the embodiments described herein. For example, in one embodiment, the pair of masks 260-1 and 260-2 include $SiO_2$.

Figure 2D:
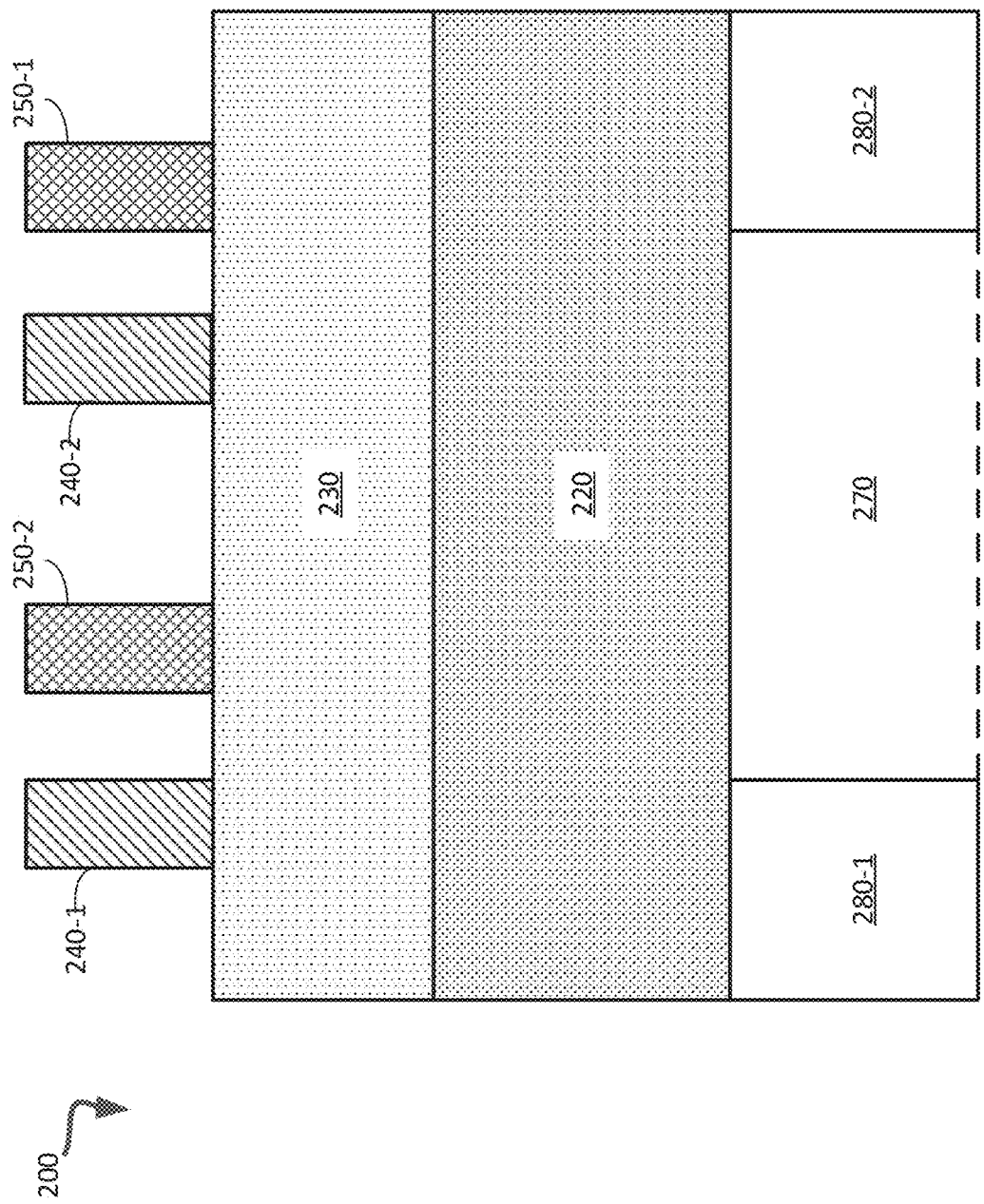

FIG. 2D shows the formation of a cavity region 270 built within the substrate 210 underneath the intermediary layer 220 to form a suspended structure. More specifically, building the cavity region 270 can include performing an etch process using the pair of masks 260-1 and 260-2 to form the cavity region 270. Any suitable etch process can be used to form the cavity region 270. In one embodiment, the etch process includes reactive-ion etching (RIE). For example, the etch process can include a deep reactive-ion etch process.

The cavity region 270 is located between resulting pair of substrate layer portions 280-1 and 280-2 that correspond to a carrier substrate or wafer for the device 200 that can be removed to provide mechanically free boundaries. The cavity region 270 can be formed to have a length much longer than its width to reduce mode distortion from the fixed boundaries in a transverse direction, as seen in the 3D mode shape that will be described in further detail below with reference to FIG. 5. In some embodiments, the cavity region 270 can be formed to have a length between about 220 μm and about 260 μm. More particularly, the cavity region 270 can be formed to have a length of about 240 μm.

In some embodiments, the cavity region 270 corresponds to an air cavity. In some embodiments, the cavity region 270 can be filled with a liquid that can enable propagation of acoustic waves. For example, the liquid can be water. However, such an embodiment should not be considered limiting. In some embodiments, the cavity region 270 corresponds to a vacuum cavity. Further details regarding FIGS. 2A-2D are described above with reference to FIGS. 1A-1B, FIGS. 9A-9B, and FIGS. 10A-10B, and will be described below with reference to FIG. 3.

Figure 3:
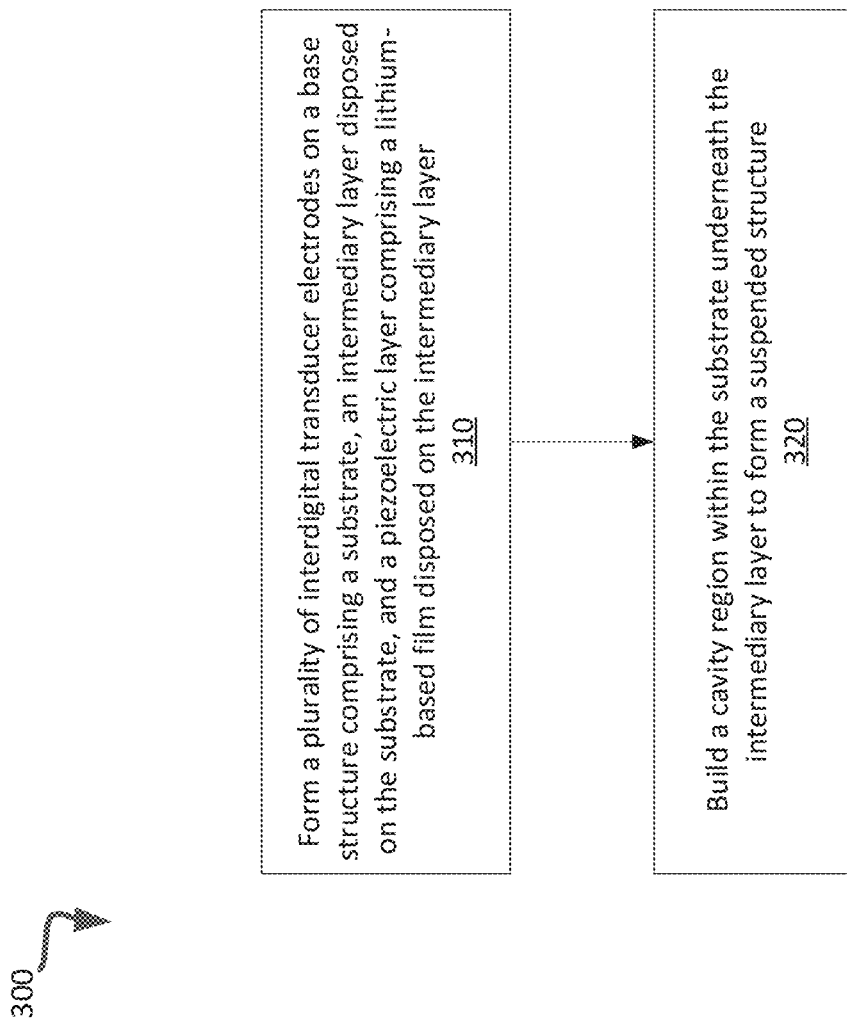
FIG. 3 is a flow diagram of the fabrication of a device including a piezoelectric micromachined ultrasonic transducer (PMUT), according to some embodiments.

FIG. 3 is a flow diagram of a method 300 for fabricating a device including a lithium niobate ($LiNbO_3$)-based piezoelectric micromachined ultrasonic transducer (PMUT), according to some embodiments. The method 300 can be performed by one or more semiconductor processing tools in a device fabrication, for example.

At block 310, a plurality of interdigital transducer electrodes (IDT electrodes) is formed on a base structure comprising a substrate, an intermediary layer disposed on the substrate, and a piezoelectric layer including a lithium-based material disposed on the intermediary layer. The piezoelectric layer and the plurality of IDT electrodes can form a resonator that can be driven by an electric field.

The substrate can include any suitable material in accordance with the embodiments described herein. In some embodiments, the substrate includes a semiconductor material. For example, the substrate can include silicon (Si). However, such an embodiment should not be considered limiting. The substrate can be formed to have any suitable thickness or height in accordance with the embodiments described herein. In some embodiments, the substrate can be formed to have a thickness or height between about 20 microns (μm) and about 700 μm. More particularly, the substrate can be formed to have a thickness or height of about 50 μm.

The intermediary layer can be formed to have any suitable thickness or height in accordance with the embodiments described herein. In some embodiments, the intermediary layer can be formed have a thickness or height between about 1 μm and about 3 μm.

The intermediary layer can include any suitable material in accordance with the embodiments described herein. For example, in some embodiments, the intermediary layer includes a passive layer. The passive layer can include any suitable material(s) in accordance with the embodiments described herein. In some embodiments, the passive layer includes a dielectric material. For example, the passive layer can include an oxide. In one embodiment, the passive layer includes silicon dioxide ($SiO_2$). The intermediary layer in this embodiment can be formed to have a thickness or height of about 2 μm.

In some embodiments, the intermediary layer includes a layer of a lithium-based material. For example, the intermediary layer can include a $LiNbO_3$ material and/or a $LiTaO_3$ material. In this embodiment, the device is formed as a bilayer (complementarily oriented piezoelectric) lithium-based PMUT. In this embodiment, the intermediary layer can be formed to have a thickness of about 0.8 μm. Further details regarding the intermediary layer will be described below.

The piezoelectric layer includes a lithium-based film. More specifically, the piezoelectric layer can include a suspended lithium-based film. For example, the piezoelectric layer can be a suspended lithium-based thin film. The piezoelectric layer can be formed to have any suitable thickness or height in accordance with the embodiments described herein. In some embodiments, the piezoelectric layer can be formed to have a thickness or height between about 0.5 μm and about 1.2 μm. More particularly, the piezoelectric layer can be formed to have a thickness or height of about 0.8 μm. In the embodiment in which the intermediary layer includes a layer of a lithium-based material, the intermediary layer can be formed from the same lithium-based material as the piezoelectric layer, but having a different material axis orientation. More specifically, the intermediary layer can include a first layer of a lithium-based material and the piezoelectric layer can include a second layer of a lithium-based material with a complementary orientation relative to the first layer (i.e., the material axis in the intermediary layer can be rotated about 180° from the piezoelectric layer, either through in-plane or out-of-plane rotation). Alternatively, the intermediary layer can be formed from a different type of lithium-based material.

In some embodiments, the piezoelectric layer can be formed to include a $LiNbO_3$ film. In some embodiments, the piezoelectric layer can be formed to include a $LiTaO_3$ film. $LiNbO_3$ and $LiTaO_3$ have very similar matrix structure, and thus the $LiTaO_3$ film can have a similar orientation as the $LiNbO_3$ film. The piezoelectric layer can have any suitable device orientation in accordance with the embodiments described herein, where the device orientation corresponds to the lateral electric field direction.

For example, the piezoelectric layer can be formed to include a $LiNbO_3$ wafer having between a 36° and a 46° Y-cut orientation. In this arrangement, the device orientation can be in-plane clockwise or counterclockwise rotated from a $LiNbO_3$ material x-axis of the lattice structure by an angle between about 35° and about 55°. More particularly, in some embodiments, the device orientation can be rotated by about 45° clockwise from the $LiNbO_3$ material x-axis. In an illustrative example, the device 100 can be oriented at between 40° to 45° (e.g., at 43°, for example) from the $LiNbO_3$ material x-axis of a 36° Y-cut $LiNbO_3$ wafer, for maximizing the $k^2$ value.

As another example, the piezoelectric layer can be formed to include a $LiNbO_3$ wafer having a 128° Y-cut orientation. In this arrangement, the device orientation can be in-plane clockwise or counterclockwise rotated from the $LiNbO_3$ material x-axis by an angle between about 80° and about 100°. More particularly, in some embodiments, the device orientation can be rotated by about 90° clockwise from the $LiNbO_3$ material x-axis.

As yet another example, the piezoelectric layer can be formed to include a $LiNbO_3$ wafer having an X-cut orientation. In this arrangement, the device orientation can be in-plane counterclockwise rotated from the $LiNbO_3$ material x-axis by an angle between about 20° and about 40°, or clockwise rotated from the $LiNbO_3$ material x-axis by an angle between about 140° and about 160°. More particularly, in some embodiments, the device orientation can be rotated by about 30° counterclockwise from the $LiNbO_3$ material x-axis.

A thickness ratio between the intermediary layer and the piezoelectric layer can be selected to efficiently harness the piezoelectricity generated by the device 200. For example, in the embodiment in which the intermediary layer includes a passive layer, if the thickness of the intermediary layer is about 2 μm and the thickness of the piezoelectric layer is about 0.8 μm, the thickness ratio between passive and piezoelectric layers and and is about 25.

The base structure can be a film stack. In one embodiment, the base structure can be formed as a $LiNbO_3$—$SiO_2$—Si film stack. In another embodiment, the base structure can be formed as a $LiNbO_3$—$LiNbO_3$—Si film stack. In another embodiment, the base structure can be formed as a $LiTaO_3$—$SiO_2$—Si film stack. In another embodiment, the base structure can be formed as a $LiTaO_3$—$LiTaO_3$—Si film stack. In another embodiment, the base structure can be formed as a $LiNbO_3$—$LiTaO_3$—Si film stack. In another embodiment, the base structure can be formed as a $LiTaO_3$—$LiNbO_3$—Si film stack. However, such a listing should not be considered exhaustive, and other combinations of materials are contemplated.

The plurality of IDT electrodes can include an outer signal (e.g., input voltage signal (VIN)) electrode, an inner signal electrode, an outer ground electrode, and an inner ground electrode. The plurality of IDT electrodes can be formed to include any suitable material(s) in accordance with the embodiments described herein. Examples of suitable material(s) that can be used to form the plurality of IDT electrodes include, but are not limited to, aluminum (Al), copper (Cu), gold (Au), silver (Ag), etc.

In some embodiments, the plurality of IDT electrodes can each be formed to have a thickness or height between about 0.1 μm and about 5 μm. More particularly, the plurality of IDT electrodes can each be formed to have a thickness or height of about 0.3 μm.

In some embodiments, the plurality of IDT electrodes can each be formed to have a width between about 3 μm and about 7 μm. More particularly, the plurality of IDT electrodes can each be formed to have a width of about 5 μm.

In some embodiments, the outer signal electrode and the outer ground electrode can each be formed to have a separation corresponding to an outer electrode distance between about 70 µm about 80 µm. More particularly, the outer electrode distance can be about 75 µm.

In some embodiments, the inner signal electrode and the inner ground electrode can each be formed to have a separation corresponding to an inner electrode distance between about 25 µm and about 35 µm. More particularly, the inner electrode distance can be about 30 µm.

A release window of the device includes portions of the piezoelectric layer, the inner signal electrode and the inner ground electrode. In some embodiments, the width of the release window can be between about 40 µm and about 60 µm, and the length of the release window can be between about 220 µm and about 260 µm. More particularly, the width of the release window can be about 240 µm and the length of the release window can be about 240 µm.

At block 320, a cavity region is built within the substrate underneath the intermediary layer to form a suspended structure. The cavity region is located between resulting pair of substrate layer portions that correspond to a carrier substrate or wafer for the lithium-based PMUT. The carrier substrate can be removed to provide mechanically free boundaries. For example, forming the cavity region can include implementing a two-mask technique. More specifically, the two-mask technique can include forming a pair of masks on the substrate, and performing an etch process using the pair of masks to form the cavity region between a pair of substrate portions that corresponding to a carrier substrate. In one embodiment, the etch process is a reactive-ion etch (RIE) process (e.g., deep RIE).

The cavity region can be formed to have a length much longer than its width to reduce mode distortion from the fixed boundaries in a transverse direction, as seen in the 3D mode shape that will be described in further detail below with reference to FIG. 5. In some embodiments, the cavity region can be formed to have a length between about 220 µm and about 260 µm. More particularly, the cavity region can be formed to have a length of about 240 µm.

In some embodiments, the cavity region corresponds to an air cavity. In some embodiments, the cavity region can be filled with a liquid that can enable propagation of acoustic waves. For example, the liquid can be water. However, such an embodiment should not be considered limiting. In some embodiments, the cavity region corresponds to a vacuum cavity. Further details regarding blocks 310 and 320 are described above with reference to FIGS. 1A-1B and FIGS. 2A-2D.

Figure 4:
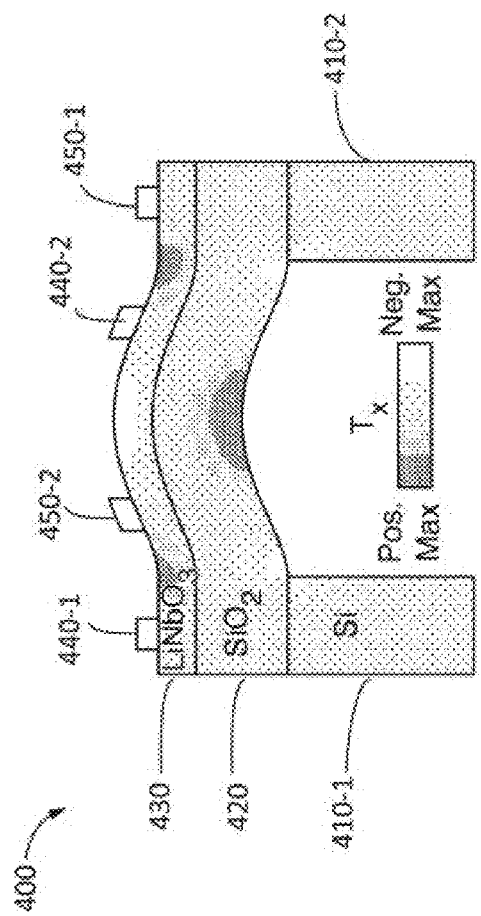
FIG. 4 is a diagram showing simulated cross-sectional stress associated with a piezoelectric micromachined ultrasonic transducer (PMUT), according to some embodiments.

FIG. 4 is a diagram 400 showing simulated cross-sectional stress associated with a PMUT, according to some embodiments. The PMUT includes silicon (Si) substrate layers 410-1 and 410-2 corresponding to a carrier substrate, a SiO$_2$ layer 420 corresponding to a passive layer disposed on the carrier substrate, an air cavity 425 in a region defined by the Si substrate layers 410-1 and 410-2 and the SiO$_2$ layer 420, a piezoelectric layer 430 disposed on the SiO$_2$ layer 420, and a plurality of electrodes disposed on the piezoelectric layer 430 including an outer signal electrode 440-1, an inner signal electrode 440-2, an outer ground electrode 450-1 and an inner ground electrode 450-2. In this illustrative embodiment, the piezoelectric layer 430 includes a LiNbO$_3$ film such that the PMUT is a LiNbO$_3$-based PMUT. However, such an embodiment should not be considered limiting. Further details regarding components 410 through 450 are described above with reference to FIGS. 1-3.

The diagram 400 shows lateral stress ($T_x$) associated with respective components of the PMUT. In operation, a lateral electric field generates $T_x$ in LiNbO$_3$. The diagram 400 indicates a magnitude of positive $T_x$ and negative $T_x$. More specifically, as shown, the lateral electric field can generate positive $T_x$ around the bend of the SiO$_2$ layer 420 directly above the air cavity 425, between the electrodes 440-1 and 450-2, and between the electrodes 440-2 and 450-1. Inversely, the lateral electric field can generate negative $T_x$ around the junctions between the Si substrate layers 410-1 and 410-2 and the passive SiO$_2$ layer, and between the electrodes 450-2 and 440-2. The longitudinal ends of the suspended region are mechanically fixed because of the larger acoustic impedance in the unreleased section. Thus, the flexural mode is excited with $T_x$ of the opposite sign in the SiO$_2$ layer 420. As shown, and as described above with reference to FIGS. 1A-1B, the electrodes 440 and 450 are placed on the nulls of the lateral stress, with the outer electrodes 440-1 and 450-1 being placed out of the suspended region to most effectively harness the piezoelectricity.

Figure 5:
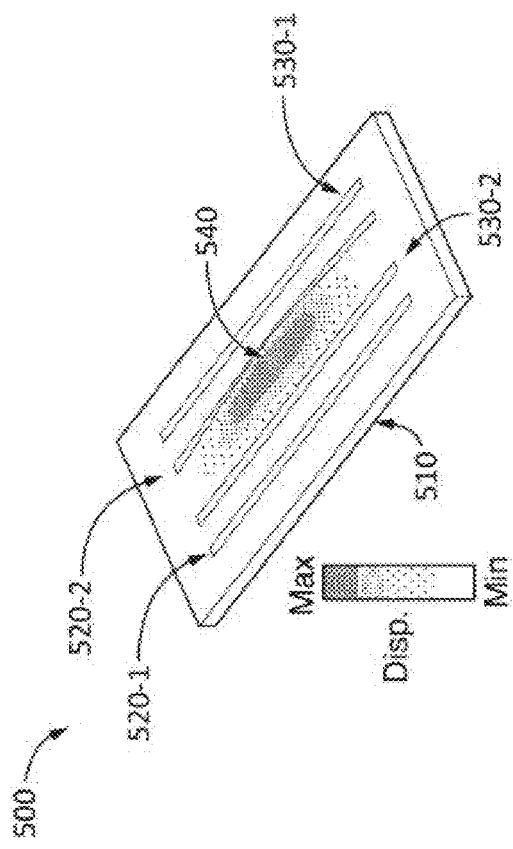
FIG. 5 is a diagram showing a simulated three-dimensional (3D) displacement mode shape associated with a piezoelectric micromachined ultrasonic transducer (PMUT), according to some embodiments.

FIG. 5 is view of a diagram 500 showing a simulated three-dimensional (3D) displacement mode shape associated with a PMUT, according to some embodiments. More specifically, the PMUT can be a lithium-based PMUT. For example, in the PMUT can be a LiNbO$_3$-based PMUT, a LiTaO$_3$-based PMUT, etc. However, such embodiments should not be considered limiting.

The diagram 500 shows a fixed substrate 510, outer signal electrode 520-1, inner signal electrode 520-2, outer ground electrode 530-1 and inner ground electrode 530-2. An out-of-plane vibration 540 is observed particularly between the inner signal electrode 520-2 and the inner ground electrode 530-2. The maximum displacement of the out-of-plane vibration 540 corresponds to the apex of the out-of-plane vibration 540 located at a midpoint of the length of the electrodes 520 and 530. The minimum displacement of the out-of-plane vibration 540 corresponds bases of the out-of-plane vibration 540 located at respective ends of the electrodes 520 and 530.

FIG. 6A is a graph 600 showing simulated admittance from a finite element analysis (FEA) associated with a PMUT, according to some embodiments. In this illustrative embodiment, the PMUT is a LiNbO$_3$-based PMUT. However, such an embodiment should not be considered limiting.

The graph 600 is shown with Butterworth-van Dyke (BVD) model fitting for a lithium-based PMUT. A BVD model may be used to interpret the measurement results so that the effects of spurious modes on the extraction of key parameters are properly accounted for. More specifically, the graph 600 shows admittance in decibels (dB) as a function of frequency in megahertz (MHz). Some design parameters are listed in an inset table 610. For example, a pronounced flexural mode ($f_s$) at 6.71 MHz is observed. The electromechanical coupling ($k^2$) (defined as $\pi^2/8 \cdot C_m/C_0$ in the BVD model) is 4.3%. The static capacitance ($C_0$) is 15.4 fF. The quality factor (Q) is set as 250, following measured data in MN PMUTs at similar frequencies.

FIG. 6B is a graph 650 showing simulated dynamic displacement near resonance associated with a PMUT, according to some embodiments. In this illustrative embodiment, the PMUT is a LiNbO$_3$-based PMUT. However, such an embodiment should not be considered limiting.

More specifically, the graph 650 shows simulated dynamic displacement in units of nanometers per volt (nm/V) as a function of normalized frequency. Dynamic displacement is extracted from out-of-plane vibration, such as the out-of-plane vibration 540 described above with reference to FIG. 5. Here, the frequency is normalized to 6.71 MHz, and the graph 650 shows a simulated dynamic displacement sensitivity of 30.8 nm/V.

FIG. 7A is a graph 700 showing measured admittance response in both air and a vacuum associated with a PMUT, according to some embodiments. In this illustrative embodiment, the PMUT is a LiNbO$_3$-based PMUT. However, such an embodiment should not be considered limiting. The graph 700 is shown with BVD model fitting.

More specifically, the graph 700 shows admittance in decibels (dB) as a function of frequency in megahertz (MHz). To measure the admittance data shown in graph 700, a network analyzer (such as Keysight N5249A PNA) can be used to measure the device in air and vacuum, respectively. The BVD fitting is also plotted and the extracted parameters are listed in the inset table 710 for each case. For example, a pronounced flexural mode ($f_s$) at 7.61 MHz is observed (i.e., resonance). This value deviates from the simulation of FIG. 6A due to fabrication non-idealities. The electromechanical coupling ($k^2$) (defined as $\pi^2/8 \cdot C_m/C_0$ in the BVD model) is 4.2% and the static capacitance ($C_0$) is 16 femtofarads (fF), which agrees with the simulation of FIG. 6A. A feedthrough capacitance ($C_f$) The quality factor in a vacuum (Q(Vac.)) is measured at 2065, indicating low structural loss of the LiNbO$_3$ PMUT, and the quality factor in air (Q(Air)) is measured at 264. The difference between the Q values is caused by the air damping, which suggests ultrasound radiation.

FIG. 7B is a graph 750 showing measured dynamic displacement near resonance associated with a PMUT, according to some embodiments. In this illustrative embodiment, the PMUT is a LiNbO$_3$-based PMUT. However, such an embodiment should not be considered limiting.

More specifically, the graph 750 shows measured dynamic displacement in units of nanometers per volt (nm/V) as a function of normalized frequency. Here, the frequency is normalized to 7.62 MHz. A vibrometer (such as Polytec Vibrometer OFV-5000) can be used to measure the dynamic displacement. The maximum displacement is measured at the center of the suspended area, and the dynamic displacement is measured at different frequencies around the resonance. At resonance (7.61 MHz), a measured dynamic displacement sensitivity of 20.2 nm/V is obtained. The degradation from the simulated dynamic displacement sensitivity (30.8 nm/V) may have originated from low fidelity in defining the suspended region of the device, and a measured dynamic displacement sensitivity closer to the simulated dynamic displacement sensitivity can be obtained by optimizing the fabrication process. A fitting curve is plotted based on the maximum sensitivity and the electrically measured Q, which agrees with the measurement near resonance.

Figures 8A, 8B:
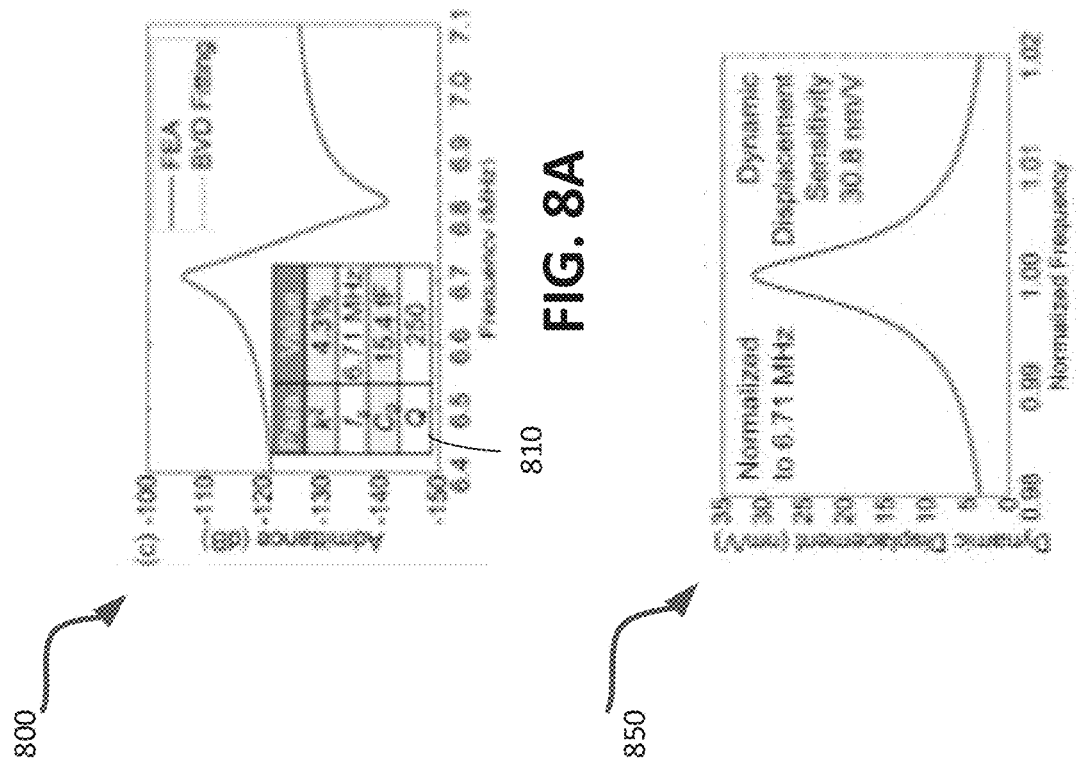
FIG. 8A is a graph showing simulated admittance from a finite element analysis (FEA) associated with a piezoelectric micromachined ultrasonic transducer (PMUT), according to some embodiments.
FIG. 8B is a graph showing simulated dynamic displacement near resonance associated with a piezoelectric micromachined ultrasonic transducer (PMUT), according to some embodiments.

FIG. 8A is a graph 800 showing simulated admittance from a finite element analysis (FEA) associated with a PMUT, according to some embodiments. In this illustrative embodiment, the PMUT is a bilayer (complementarily oriented piezoelectric) LiNbO$_3$-based PMUT. However, such an embodiment should not be considered limiting. The graph 800 is shown with BVD model fitting.

More specifically, the graph 800 shows admittance in decibels (dB) as a function of frequency in megahertz (MHz). Some design parameters are listed in an inset table 810. For example, a pronounced flexural mode ($f_s$) at 6.71 MHz is observed. The electromechanical coupling ($k^2$) (defined as $\pi^2/8 \cdot C_m/C_0$ in the BVD model) is 4.3%. The static capacitance ($C_0$) is 15.4 fF. The quality factor (Q) is set as 250, following measured data in MN PMUTs at similar frequencies.

FIG. 8B is a graph 850 showing simulated dynamic displacement near resonance associated with a PMUT, according to some embodiments. In this illustrative embodiment, the PMUT is a bilayer (complementarily oriented piezoelectric) LiNbO$_3$-based PMUT. However, such an embodiment should not be considered limiting.

More specifically, the graph 850 shows simulated dynamic displacement in units of nanometers per volt (nm/V) as a function of normalized frequency. Dynamic displacement is extracted from out-of-plane vibration, such as the out-of-plane vibration 540 described above with reference to FIG. 5. Here, the frequency is normalized to 4.56 MHz, and the graph 850 shows a simulated dynamic displacement sensitivity of 92.7 nm/V.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device comprising:
   a pair of substrate layers corresponding to a carrier substrate;
   an intermediary layer comprising a passive layer disposed on the pair of substrate layers;
   a piezoelectric layer comprising a lithium-based material disposed on the passive layer; and
   a plurality of interdigital transducer electrodes disposed on the piezoelectric layer, wherein the plurality of interdigital transducer electrodes comprises an outer signal electrode, an inner signal electrode, an outer ground electrode, and an inner ground electrode.

2. The device of claim 1, wherein the piezoelectric layer comprises at least one of lithium niobate (LiNbO$_3$) or lithium tantalate (LiTaO$_3$).

3. The device of claim 1, wherein the piezoelectric layer comprises a suspended lithium-based thin film, and wherein the suspended lithium-based thin film comprises a 36° Y-cut wafer.

4. The device of claim 1, further comprising a cavity region formed between the pair of substrate layers underneath the passive layer, wherein the piezoelectric layer and the plurality of interdigital transducer electrodes form a resonator.

5. The device of claim 4, wherein:
the pair of substrate layers each have a thickness between about 20 microns (μm) and about 700 μm;
the cavity region has a length between about 220 μm and about 260 μm;
the intermediary layer has a thickness between about 1 μm and about 3 μm;
the piezoelectric layer has a thickness between about 0.5 μm and about 1.2 μm; and
each interdigital transducer electrode of the plurality of interdigital transducer electrodes has a thickness between about 0.1 μm and 0.5 μm.

6. The device of claim 1, wherein:
each interdigital transducer electrode of the plurality of interdigital transducer electrodes has a width between about 3 microns (μm) and about 7 μm;
the outer signal electrode and the outer ground electrode have a separation by an outer electrode distance between about 70 μm and about 80 μm; and
the inner signal electrode and the inner ground electrode have a separation by an inner electrode distance between about 25 μm and about 35 μm.

7. A piezoelectric micromachined ultrasonic transducer (PMUT) comprising:
a pair of substrate layers corresponding to a carrier substrate;
an intermediary layer comprising a first lithium-based material disposed on the pair of substrate layers;
a piezoelectric layer comprising a second lithium-based material disposed on the intermediary layer, wherein a first cut-plane orientation of the first lithium-based material is different from a second cut-plane orientation of the second lithium-based material; and
a plurality of interdigital transducer electrodes disposed on the piezoelectric layer, wherein the plurality of interdigital transducer electrodes comprises an outer signal electrode, an inner signal electrode, an outer ground electrode, and an inner ground electrode.

8. The PMUT of claim 7, wherein the piezoelectric layer comprises at least one of lithium niobate ($LiNbO_3$) or lithium tantalate ($LiTaO_3$).

9. The PMUT of claim 7, wherein the piezoelectric layer comprises a suspended lithium-based thin film, and wherein the suspended lithium-based thin film comprises a 36° Y-cut wafer.

10. The PMUT of claim 7, wherein the first lithium-based material has a complementary cut plane orientation relative to the second lithium-based material.

11. The PMUT of claim 7, further comprising a cavity region formed between the pair of substrate layers underneath the intermediary layer, wherein the piezoelectric layer and the plurality of interdigital transducer electrodes form a resonator.

12. The PMUT of claim 11, wherein:
the pair of substrate layers each have a thickness between about 20 microns (μm) and about 700 μm;
the cavity region has a length between about 220 μm and about 260 μm;
the intermediary layer has a thickness between about 1 μm and about 3 μm;
the piezoelectric layer has a thickness between about 0.5 μm and about 1.2 μm; and
each interdigital transducer electrode of the plurality of interdigital transducer electrodes has a thickness between about 0.1 μm and 0.5 μm.

13. The PMUT of claim 7, wherein:
each interdigital transducer electrode of the plurality of interdigital transducer electrodes has a width between about 3 microns (μm) and about 7 μm;
the outer signal electrode and the outer ground electrode have a separation by an outer electrode distance between about 70 μm and about 80 μm; and
the inner signal electrode and the inner ground electrode have a separation by an inner electrode distance between about 25 μm and about 35 μm.

\* \* \* \* \*